(12) United States Patent
Eichler et al.

(10) Patent No.: US 10,673,201 B2
(45) Date of Patent: Jun. 2, 2020

(54) SEMICONDUCTOR LIGHT SOURCE

(71) Applicant: OSRAM OLED GmbH, Regensburg (DE)

(72) Inventors: Christoph Eichler, Donaustauf (DE); Sven Gerhard, Alteglofsheim (DE); Alfred Lell, Maxhütte-Haidhof (DE); Bernhard Stojetz, Wiesent (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/311,868

(22) PCT Filed: Jun. 7, 2017

(86) PCT No.: PCT/EP2017/063846
§ 371 (c)(1),
(2) Date: Dec. 20, 2018

(87) PCT Pub. No.: WO2018/220325
PCT Pub. Date: Dec. 28, 2017

(65) Prior Publication Data
US 2019/0199056 A1    Jun. 27, 2019

(30) Foreign Application Priority Data

Jun. 22, 2016  (DE) ...................... 10 2016 111 442

(51) Int. Cl.
*H01S 5/00* (2006.01)
*H01S 5/028* (2006.01)
(Continued)

(52) U.S. Cl.
CPC ............ *H01S 5/005* (2013.01); *H01S 5/0287* (2013.01); *H01S 5/101* (2013.01); *H01S 5/1071* (2013.01);
(Continued)

(58) Field of Classification Search
CPC ........ H01S 5/005; H01S 5/0287; H01S 5/101; H01S 5/1071; H01S 5/22; H01S 5/4031
See application file for complete search history.

(56) References Cited

U.S. PATENT DOCUMENTS

2008/0121919 A1 * 5/2008 Krames .................. B82Y 30/00
257/98
2008/0273564 A1    11/2008 Wang et al.
(Continued)

FOREIGN PATENT DOCUMENTS

DE    10 2008 012 859        11/2009
DE    10 2011 100 175 A1    11/2012
(Continued)

OTHER PUBLICATIONS

Xu, Y. et al., "Phosphor-Conversion White Light Using InGaN Ultraviolet Laser Diode," *Applied Physics Letters*, Jan. 18, 2008, vol. 92, pp. 021129-1-3.
(Continued)

*Primary Examiner* — Christine A Enad
(74) *Attorney, Agent, or Firm* — DLA Piper LLP (US)

(57) ABSTRACT

A semiconductor light source includes a laser and at least one phosphor, wherein the laser includes a semiconductor body having at least one active zone that generates laser radiation, at least one resonator having resonator mirrors and having a longitudinal axis is formed in the laser so that the laser radiation is guided and amplified along the longitudinal axis during operation and the active zone is located at least partially in the resonator, and the phosphor is optically coupled to the resonator in a gap-free manner so that in the direction transverse to the longitudinal axis at least part of the laser radiation is introduced into the phosphor and converted into a secondary radiation having a greater wavelength.

19 Claims, 15 Drawing Sheets

(51) Int. Cl.
*H01S 5/10* (2006.01)
*H01S 5/22* (2006.01)
*H01S 5/40* (2006.01)

(52) U.S. Cl.
CPC .............. *H01S 5/22* (2013.01); *H01S 5/4031* (2013.01); *H01S 5/1017* (2013.01); *H01S 2301/17* (2013.01)

(56) References Cited

U.S. PATENT DOCUMENTS

| | | | |
|---|---|---|---|
| 2009/0065800 A1 | 3/2009 | Wirth et al. | |
| 2009/0268770 A1 | 10/2009 | Wang et al. | |
| 2011/0206079 A1 | 8/2011 | Hsieh et al. | |
| 2013/0243020 A1* | 9/2013 | Kim | H01S 5/0224 372/36 |
| 2014/0055845 A1* | 2/2014 | Jain | H01S 5/005 359/344 |
| 2014/0064311 A1 | 3/2014 | Eichler et al. | |
| 2014/0177663 A1 | 6/2014 | Finsterbusch et al. | |
| 2015/0194788 A1* | 7/2015 | Mueller | H01S 5/0425 372/45.01 |
| 2016/0087404 A1 | 3/2016 | Lell et al. | |

FOREIGN PATENT DOCUMENTS

| | | |
|---|---|---|
| EP | 2 453 487 | 5/2012 |
| EP | 2 549 330 | 1/2013 |
| EP | 2 672 178 | 12/2013 |
| JP | 2006-261222 A | 9/2006 |
| JP | 2008-010816 A | 1/2008 |
| JP | 2012-79989 | 4/2012 |
| JP | 2014-522110 A | 8/2014 |
| JP | 2015-159172 A | 9/2015 |

OTHER PUBLICATIONS

Notification of Reasons for Refusal dated Nov. 25, 2019, of counterpart Japanese Application No. 2018-567103, along with an English translation.

The First Office Action dated Mar. 18, 2020, of counterpart Chinese Application No. 201780039226.4, along with an English translation.

* cited by examiner

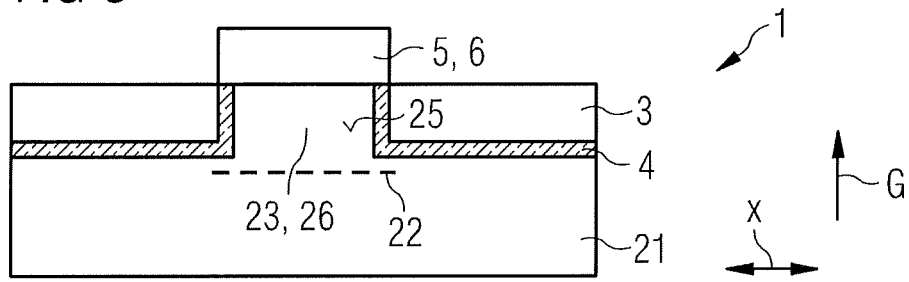
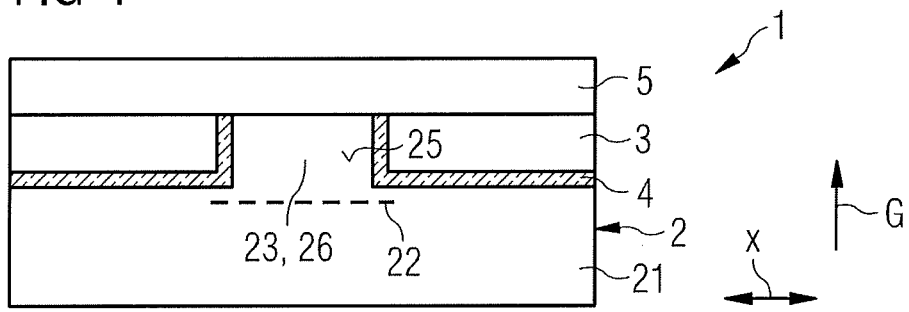
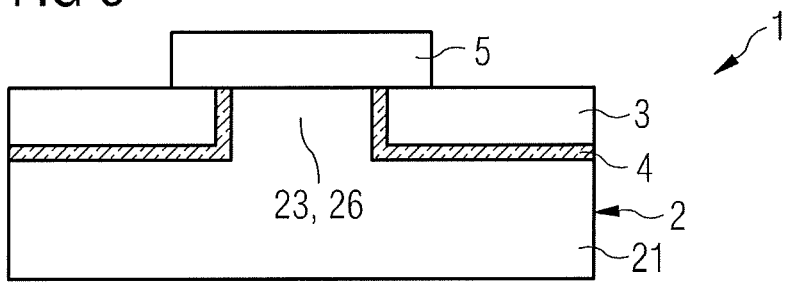
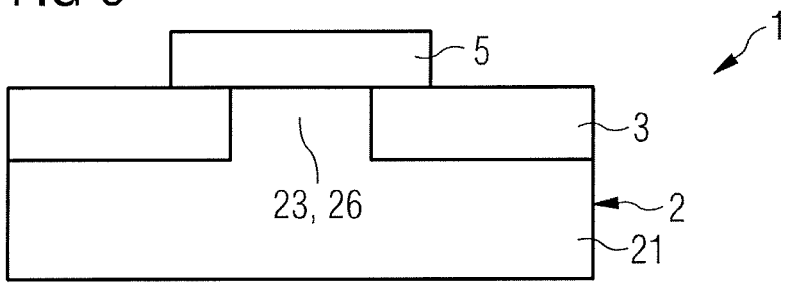

SEMICONDUCTOR LIGHT SOURCE

TECHNICAL FIELD

This disclosure relates to a semiconductor light source.

BACKGROUND

There is a need to provide a semiconductor light source by which incoherent different colored light can be efficiently generated.

SUMMARY

We provide a semiconductor light source including a laser and at least one phosphor, wherein the laser includes a semiconductor body having at least one active zone that generates laser radiation, at least one resonator having resonator mirrors and having a longitudinal axis is formed in the laser so that the laser radiation is guided and amplified along the longitudinal axis during operation and the active zone is located at least partially in the resonator, and the phosphor is optically coupled to the resonator in a gap-free manner so that in the direction transverse to the longitudinal axis at least part of the laser radiation is introduced into the phosphor and converted into a secondary radiation having a greater wavelength.

We also provide a semiconductor light source including a laser and at least one scattering means, wherein the laser includes a semiconductor body having at least one active zone that generates laser radiation, at least one resonator having resonator mirrors and having a longitudinal axis is formed in the laser so that the laser radiation is guided and amplified along the longitudinal axis during operation and the active zone is located at least partially in the resonator, and the scattering means is optically coupled to the resonator in a gap-free manner so that in the direction transverse to the longitudinal axis the laser radiation is introduced into the scattering means and is scattered by the same so that a coherence length of the emitted laser radiation is reduced to at most 10 μm by the scattering means.

BRIEF DESCRIPTION OF THE DRAWINGS

FIGS. 3 to 22 show schematic sectional representations of examples of our semiconductor light sources.

Figure 1:
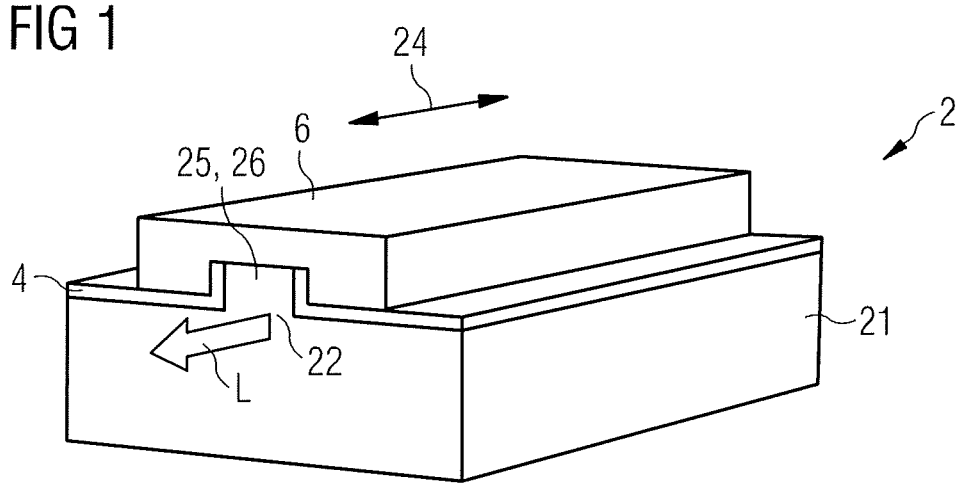
FIG. 1 shows a perspective representation of a modification of a light source.

LIST OF REFERENCE SIGNS 1 semiconductor light source
2 laser
21 semiconductor body
22 active zone
23 resonator
24 longitudinal axis
25 resonator mirror
26 ridge waveguide
27 roughening
28 recess
3 phosphor
33 scattering means
4 electrically insulating passivation layer
5 light-transmissive electrically conductive contact layer
6 light-impermeable electrical contact layer
7 mirror
8 electrical rear side contact
G growth direction
K curvature
L laser radiation
S secondary radiation
x transverse direction

DETAILED DESCRIPTION

Our semiconductor light source comprises one or more lasers. The at least one laser generates a superluminescent radiation and/or a laser radiation. Preferably, laser radiation is generated above a laser threshold exceeded in the intended operation.

The semiconductor light source may comprise one or more phosphors or a phosphor mixture. The phosphor or the phosphor mixture preferably comprises at least one of the following luminescent materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$. The phosphors specified in EP 2 549 330 A1 can also be used as phosphors. With regard to the phosphors used, the disclosure content of EP '330 is incorporated herein by reference. Quantum dots may moreover also be introduced as luminescent material. Quantum dots in the form of nanocrystalline materials containing a group II-VI compound and/or a group III-V compound and/or a group IV-VI compound and/or metal nanocrystals, are preferred.

Furthermore, the phosphor can be formed from an epitaxially grown semiconductor layer having one or more quantum well structures such as quantum films or quantum dots. Corresponding quantum well structures emit by photoluminescence. Furthermore, it is possible for the phosphor to be formed by an at least partially closed layer, or it is formed by individual semiconductor particles, for instance with quantum dots, or contains such particles.

Furthermore, it is possible for the phosphor to be completely replaced by a scattering means or that a scattering means is present in addition to the phosphor. A scattering means is formed, for example, by a geometric structuring of a layer, for example, a roughening. Furthermore, the scattering means can be formed by a mixture of two materials having different refractive indices, for example, by a light-transmissive matrix in which scattering elements such as scattering particles or cavities are contained. For example, the scattering means is formed by a silicone layer in which titanium dioxide particles are embedded. In contrast to a phosphor, the scattering means does not lead to any or not to a significant change in a spectrum of the laser radiation. Only a spatial emission characteristic and coherence properties of the laser radiation are changed by the scattering means. The examples of arranging the phosphor apply to the scattering means in the same way.

A coherence length of the emitted laser radiation and/or of radiated mixed-colored light may be reduced by the scattering means and/or the phosphor to at most 10 μm or 5 μm. In other words, a comparatively strong, uncorrelated and stochastic scattering or deflection of the laser radiation is carried out at the scattering means and/or at the phosphor so that coherence is lost or substantially lost. The coherence length may be adjusted in particular by an amount of the scattering means and/or of the phosphor.

The at least one laser may comprise a semiconductor body. The semiconductor body comprises a semiconductor layer sequence. At least one active zone that generates the laser radiation is formed in the semiconductor layer sequence. In the active zone, the laser radiation is generated by electroluminescence. The semiconductor layer sequence is preferably based on a III-V compound semiconductor material. The semiconductor material is, for example, a nitride compound semiconductor material such as $Al_xIn_yGa_{1-x-y}N$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, wherein in each case $0 \leq x \leq 1$, $0 \leq y \leq 1$, $x+y \leq 1$, $0 \leq n \leq 1$, $0 \leq m \leq 1$ and $n+m \leq 1$ and $0 \leq k < 1$. Preferably, $0 \leq x \leq 0.9$ and $0 \leq y \leq 0.4$ as well as $0 < n \leq 0.8$, $0.2 \leq m < 1$ and $n+m \leq 0.95$ and $0 < k \leq 0.5$ apply for at least one layer or for all layers of the semiconductor layer sequence. The semiconductor layer sequence can have dopants and additional components. For the sake of simplicity, however, only the essential components of the crystal lattice of the semiconductor layer sequence, that is Al, As, Ga, In, N or P, are mentioned, even if they can be partially replaced and/or supplemented by small quantities of further substances.

One or more resonators may be formed in the laser. The resonators preferably each have one or more resonator mirrors. Furthermore, the resonators preferably each have a longitudinal axis. The laser radiation is guided along the longitudinal axis, in particular by the resonator mirrors. In this case, the resonator mirrors and/or the longitudinal axis can be straight or curved. In a straight longitudinal axis, the resonator mirrors are preferably oriented perpendicular to the longitudinal axis. In curved longitudinal axes, for example, in ring resonators, the resonator mirrors can also be arranged tangentially to the then annular longitudinal axis.

During operation of the semiconductor light source, guidance of the laser radiation and preferably also amplification of the laser radiation takes place along the longitudinal axis. In other words, an active laser medium is mounted along the longitudinal axis, in particular in the form of the active zone such that stimulated radiation emission takes place in the region along the longitudinal axis. Furthermore, the active zone is located in the resonator, preferably only partly.

The phosphor may be optically coupled to the resonator. This means in particular that laser radiation guided in the resonator can interact with the phosphor. Preferably, the phosphor is coupled to the resonator without a gap so that there is no cavity between the phosphor and the resonator evacuated or filled with a gas.

The laser radiation may pass predominantly or exclusively into the phosphor in the direction transverse to the longitudinal axis. Transverse means at an angle not equal to 0°, for example, at an angle of at least 30° or 60°. In the phosphor, the laser radiation is converted into a secondary radiation. The secondary radiation preferably has a greater wavelength than the laser radiation. The laser radiation reaching the phosphor is partially or completely converted into the secondary radiation so that in particular no laser radiation passes through the phosphor.

The semiconductor light source may comprise a laser and at least one phosphor. The laser comprises a semiconductor body having at least one active zone that generates laser radiation. At least one resonator with resonator mirrors and having a longitudinal axis is formed in the laser. The laser radiation is guided and amplified along the longitudinal axis during operation. The active zone is located at least partially in the resonator. The phosphor is optically coupled to the resonator preferably without a gap so that at least part of the laser radiation passes into the phosphor in the direction transverse to the longitudinal axis and is converted into a secondary radiation having a greater wavelength.

Light-emitting semiconductor components are formed, for example, by light-emitting diodes, LEDs for short, and laser diodes. LEDs can be combined with phosphors, for example, to generate white light and exhibit high efficiency at low current densities. However, the efficiency of LEDs decreases towards high current densities, which is known as "droop." To achieve high powers with sufficient efficiency with LEDs, the LEDs have to have a comparatively large surface area, as a result of which high production costs are associated.

In laser diodes, on the other hand, a charge carrier density above the laser threshold is approximately constant, i.e. the charge carrier density does not increase or does not significantly increase from the laser threshold. As a result, the droop effect can be reduced or eliminated and the components can be operated efficiently at higher current densities. In lasers, however, the radiation is emitted at a relatively small exit region so that very high power densities occur in this region. If a laser facet is directly coated with phosphors, thus, the high power density at the facet can lead to saturation and/or destruction of the phosphor. Other approaches are to illuminate a luminophore with a separate laser, wherein optical elements or free-running optical paths are usually interposed. The separate arrangement of the phosphor and the laser increases a component's size and, as a rule, additional optical elements are required.

In our semiconductor light source, a laser is used that can be efficiently operated at high current densities. An optical coupling of the phosphor does not take place via a facet, in particular a resonator mirror, but the coupling takes place along the resonator. Thus, the phosphor can be efficiently excited over a comparatively long way with the laser radiation at relatively moderate light outputs. The optical coupling of the phosphor to the resonator is effected, for example, by relatively thin cladding layers, by roughening and/or surface structures of the resonator and/or of a material forming the resonator. Photonic crystals or optical gratings can also be used for coupling. With the semiconductor light source, compact designs with low space requirements can thus be realized even at high power densities.

The resonator mirror may be impermeable or almost impermeable to the laser radiation. This applies in particular to straight longitudinal axes and resonator mirrors oriented perpendicular to the longitudinal axis. The same is preferably true for angled longitudinal axes having a plurality of straight sections, wherein the sections are each delimited by two resonator mirrors. For example, in such a longitudinal axis via the resonator mirrors, in the intended use of the semiconductor light source, at most 20% or 10% or 5% or 2% or 1% or 0.1% of the laser radiation exits from the resonator. This means that the predominant portion of the laser radiation is transmitted transversely to the longitudinal axis into the phosphor and not via the resonator mirrors.

In addition to the secondary radiation, part of the laser radiation may also leave the semiconductor light source during operation so that mixed-colored light is emitted. The mixed-colored light is, for example, white light, which can be composed, for example, of yellow secondary radiation and blue laser radiation or of red and green secondary radiation and of blue laser radiation and which is particularly preferably incoherent radiation.

The semiconductor laser may have an elevation along the longitudinal axis. A ridge waveguide made of a semiconductor material of the semiconductor body is formed by the elevation. The resonator is defined via the ridge waveguide. The laser radiation is guided along the ridge waveguide and thus along the longitudinal axis. Such ridge waveguides are also referred to as stripe waveguides.

Only the secondary radiation and not the laser radiation may leave the semiconductor light source. The laser radiation is in particular completely converted into the secondary radiation by the phosphor. It is possible for filter elements to be present, which filter out a small remaining portion of the laser radiation which may be present under some circumstances and prevent it from leaving the semiconductor light source.

The at least one phosphor may be partially or completely adjacent to the ridge waveguide, in the direction perpendicular to a growth direction of the semiconductor body and in the direction transverse to the longitudinal axis. In other words, the phosphor and the ridge waveguide are located in the same plane perpendicular to the growth direction.

The ridge waveguide may extend at least in places between two successive resonator mirrors in a curved manner. This applies in particular in a plan view parallel to the growth direction. As a result of this curvature of the resonator, a quality factor of the resonator can be reduced so that a coupling of the laser radiation to the phosphor is increased.

The ridge waveguide and/or the resonator may have a varying width at least in regions along the longitudinal axis. The width varies, for example, by at least 1% or 5% or 10% and/or by at most 30% or 25% or 20%, relative to an average width of the ridge waveguide. As a result of this varying width, a quality factor of the resonator can be reduced. Thus, the degree of laser radiation coupled out into the phosphor is increased by the varying width.

The laser may be designed to be operated in a gain-guided manner. Such lasers are also referred to as broad stripe lasers. This means that the semiconductor body has a constant thickness in the region of the resonator and no ridge waveguide. In this case, the resonator is preferably not defined by a structuring of the semiconductor body, but by a structure of an electrical contact. For example, the active zone is then energized only along the longitudinal direction.

The semiconductor body may have a roughening on one or on two main sides and/or on side faces. The main sides are oriented in particular perpendicular to the growth direction. The side faces can be flanks of the ridge waveguide running transversely to the main sides. The roughening is configured to scatter and/or to deflect the laser radiation guided in the resonator. The roughening preferably extends close to the resonator such that a significant intensity of the laser radiation is present at the roughening. An average depth or roughness of the roughening is preferably at least 25 nm or 50 nm or $\lambda/4n$ or $\lambda/n$, wherein $\lambda$ stands for a peak wavelength of the laser radiation and n stands for an average refractive index of a material of the semiconductor body.

The phosphor may be partially or completely located on the same side of the semiconductor body as the roughening. Alternatively, it is possible for the phosphor to be located partially or completely on a side of the semiconductor body opposite the roughening. It is possible for the phosphor to be at least partially introduced into the roughening.

The phosphor may be in direct contact with the semiconductor body. This means that the phosphor and the semiconductor body touch each other. In this case, it is possible for the phosphor to be formed from one or more semiconductor materials. In particular, the phosphor can be deposited, for example, epitaxially on the semiconductor body.

The phosphor may not touch the semiconductor body. This means that the phosphor may be mounted at a distance from the semiconductor body. In this case, a distance between the phosphor and the semiconductor body is preferably small. This means that a minimum distance between the phosphor and the semiconductor body is at most 10% or 5% or 1% of a length of the resonator along the longitudinal axis.

The minimum distance between the phosphor and the semiconductor body may be at most 2 μm or 1 μm or 0.5 μm or 0.2 μm. Alternatively or additionally, the average distance is at least 20 nm or 50 nm or 0.1 μm.

Between the phosphor and the semiconductor body, in places or over the whole area, an electrically insulating passivation layer may be located which is permeable to the laser radiation. The passivation layer is produced, for example, from a nitride or oxide such as silicon dioxide. It is possible that only the passivation layer is present between the phosphor and the semiconductor body or that further additional layers are present.

In places between the phosphor and the semiconductor body, there may be an electrically conductive contact layer transmissive to the laser radiation. The contact layer is designed to energize the semiconductor body. In particular, the contact layer is produced from a transparent conductive oxide, TCO for short, such as ITO. It is possible that only the contact layer is present between the phosphor and the semiconductor body or that further layers are present between the phosphor and the semiconductor body.

The phosphor may be partially or completely embedded in the semiconductor body. Embedded can mean that the semiconductor body is located on at least three sides of the embedded phosphor as seen in cross section. In particular, the phosphor is introduced into a channel or groove on the semiconductor body. The channel or groove can be V-shaped, rectangular or U-shaped when viewed in cross section or can be formed by combinations thereof. In this case, the phosphor can project beyond the semiconductor body, along the growth direction, or vice versa.

The laser may comprise a plurality of the resonators. In this case, a predominant portion of the resonators or, preferably, all the resonators are designed to generate the laser radiation. The individual resonators can be designed for laser radiation of different wavelengths or they all generate laser radiation of the same wavelength.

A predominant portion of the resonators or all of the resonators may be configured to irradiate the respective laser radiation into the phosphor. In other words, a coupling of the laser radiation to the phosphor can be provided along the longitudinal axes of each of the resonators.

The phosphor may be partially or completely located between two adjacent resonators. This can apply in a plan view or also in cross section. If the resonators are realized by ridge waveguides, it is possible that the phosphor is mounted partially or completely between the resonators and thus between the ridge waveguides.

The resonator may be curved and/or bent when viewed in a plan view. The resonator can run in a meandering or spiral shape or in a round manner. In this case, a plurality of resonators can, for example, be arranged concentrically around one another.

The phosphor may extend along the entire resonator, preferably on both sides of the resonator, in particular when viewed in a plan view. The laser radiation can thus be radiated into the phosphor on both sides along the entire resonator. Thus, there is a large-area optical coupling between the resonator and the phosphor.

A plurality of phosphors emitting different colors may be present, wherein the phosphors are formed in particular by quantum well structures. For example, one phosphor is used to generate red light, one phosphor to generate blue light and one phosphor to generate green light. It is possible that a resonator associated with the respective phosphor can be operated electrically independently of the further resonators. A color of the light emitted by the semiconductor light source is thus composed of a plurality of different secondary radiations from the different phosphors, and can be variably adjusted during operation. In particular when using quantum well structures for the phosphor, narrow-band emissions, that is spectrally narrow-band secondary radiations, can be realized. This enables the use in displays with good color rendering.

The phosphor may extend only partially along the longitudinal axis and/or along the resonator. It is possible that only in regions in which the phosphor is present the laser radiation exits the resonator transversely to the longitudinal axis.

The semiconductor light source described here can, for example, be used in general lighting as a replacement for conventional LEDs provided with a luminescent substance. Likewise, semiconductor light sources described here can be used in headlights, for example, in the theater area or in the motor vehicle sector, since the semiconductor light source has a comparatively low emission area at a high intensity, which facilitates handling of the emitted secondary radiation by subsequent optics. The semiconductor light source can also be used as a background illumination for displays or also as individual image points that can be set in different colors, for example, in large-format display panels.

A semiconductor light source described here is explained in more detail below with reference to the drawings on the basis of examples. Identical reference signs indicate the same elements in the individual figures. However, no relationships to scale are illustrated. Rather, individual elements can be represented with an exaggerated size to afford a better understanding.

FIG. 1 shows a modification of a light source. The light source comprises a laser 2 having a semiconductor body 21. In an active zone 22, a laser radiation L is generated. At a ridge waveguide 26 formed from the semiconductor body 21, an electrical contact layer 6 that feeds current into the ridge waveguide 26 is located. Adjacent to the ridge waveguide 26 and on side faces of the ridge waveguide 26, there is an electrically insulating passivation layer 4.

A resonator mirror 25 is located at a facet of the laser 2, via the resonator mirror 25 the laser radiation L is coupled out of the laser 2 as intended. At one of the facets, which delimit the resonator of the laser 2 along a longitudinal axis 24, there is thus a highly reflective resonator mirror 25, on which no coupling-out takes place, and the coupling-out mirror illustrated in FIG. 1 is located on the opposite facet. According to FIG. 1, radiation is emitted at one of the facets in a comparatively small area. Furthermore, the laser radiation L is emitted immediately.

Figure 2:
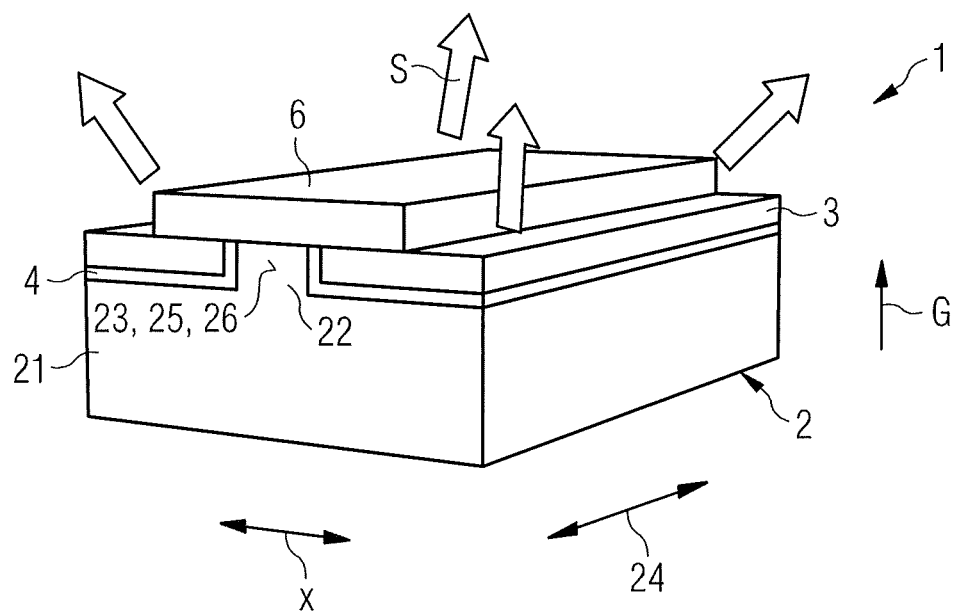
FIG. 2 shows a schematic perspective illustration of an example of our semiconductor light source.

In the example of the semiconductor light source 1, as shown in FIG. 2, in contrast, both resonator mirrors 25, which delimit the resonator 23 along the longitudinal axis 24, are highly reflective to the laser radiation. Thus, no decoupling or emission of radiation takes place at the resonator mirrors 25.

Instead, in a transverse direction x, that is perpendicular to the longitudinal axis 24 and perpendicular to a growth direction G of the semiconductor layer sequence, at least one phosphor 3 is located close to the resonator 23. The phosphor 3 is located so close to the resonator 23 that the laser radiation guided in the resonator 23 is optically coupled to the phosphor 3 and converted into a secondary radiation S having a greater wavelength. This results in a relatively large-area emission of the secondary radiation S over the entire longitudinal axis 24 of the resonator 23. In addition, the secondary radiation S is an incoherent radiation for which preferably no laser protection regulations must be observed. The laser radiation which is guided and generated in the resonator 23 is thus preferably completely converted into the secondary radiation S by the phosphor 3.

In the illustration of FIG. 3, the active zone 22 is located along the growth direction G below the ridge waveguide 26. The phosphor 3 terminates flush with the ridge waveguide 26 along the growth direction G. The contact layer 5, 6, which can be light-transmissive or also opaque, terminates flush with the ridge waveguide 26 or flush with the passivation layer 4 in the transverse direction x. The passivation layer 4 is formed, for example, from silicon dioxide having a thickness of 150 nm. The contact layer 5, 6 does not cover the phosphor 3, viewed in a plan view.

In the example of FIG. 4, the light-transmissive contact layer 5 covers the entire phosphor 3 and thus the ridge waveguide 26. The contact layer 5 is formed, for example, from a transparent metal oxide such as ITO. The ITO is preferably formed from 90% to 95% of $In_2O_3$ and from 5% to 10% of $SnO_2$. Alternatively, the light-transmissive contact layer 5 is produced from zinc oxide.

In the example of FIG. 5, it is shown that the light-transmissive contact layer 5 only partially covers the phosphor 3. The phosphor 3 can thus be in direct contact with the light-transmissive contact layer 5 in places.

The passivation layer 4 is, as is also possible in all other examples, of an oxide, nitride or oxynitride of Al, Ce, Ga, Hf, In, Mg, Nb, Rh, Sb, Si, Sn, Ta, Ti, Zn and/or Zr. Furthermore, the passivation layer 4 can be produced of a highly heat-conductive material such as SiC, diamond or diamond-like carbon, DLC for short. A thickness of the passivation layer 4 is preferably at least 5 nm or 10 nm and/or at most 5 µm or 0.2 µm or 40 nm.

According to FIG. 6, the preferably electrically insulating phosphor 3 is located directly on the semiconductor body 21 with the ridge waveguide 26. Side faces of the ridge waveguide 26 are completely covered by the phosphor 3.

Figure 7:
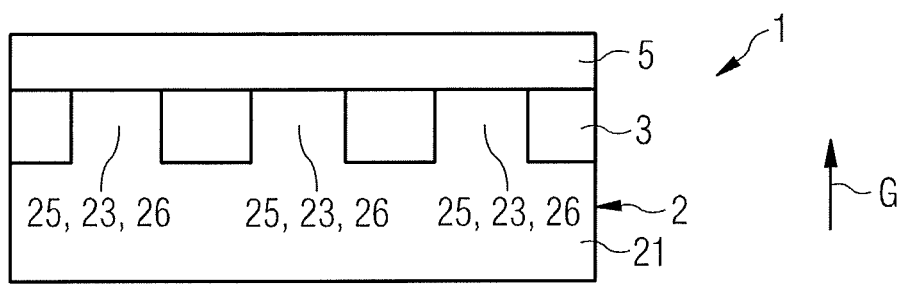

In the example of FIG. 7, it can be seen that a plurality of resonators 23 and thus a plurality of ridge waveguides 26 are present. Laser radiation is preferably generated in each of the ridge waveguides 26. The phosphor 3 is introduced into the semiconductor body 21 on both sides of the ridge waveguides 26 and terminates approximately flush with the semiconductor body 21, along the growth direction G. The light-transmissive contact layer 5 completely covers the ridge waveguides 26 and the phosphor 3.

Figure 8:
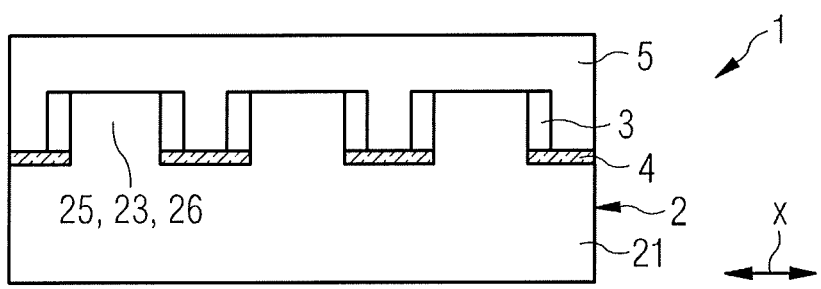

In the example of FIG. 8, each passivation layer 4 is located between adjacent ridge waveguides 26 along the transverse direction x. The side faces of the ridge waveguides 26 are, as far as not covered by the passivation layer 4, coated with a layer of the phosphor 3. In this case, the phosphor 3 does not extend continuously from one of the ridge waveguides 26 to an adjacent ridge waveguide 26. A material of the transparent contact layer 5 extends as far as the passivation layer 4, at least in regions located between adjacent ridge waveguides 26 and/or between adjacent regions with the phosphor 3.

Figure 9:
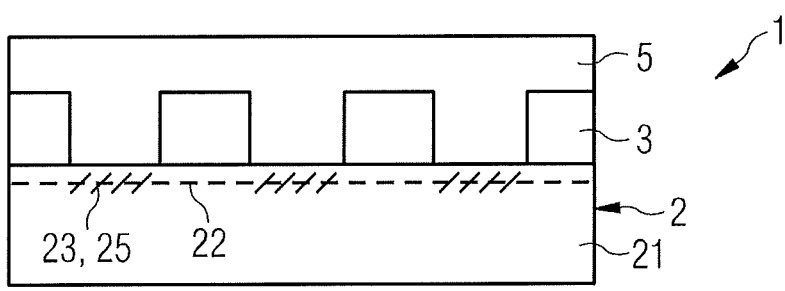

FIG. 9 shows that the laser 2 is designed as a broad stripe laser, also referred to as a gain-guided laser. The resonators 23 are formed in regions in which the light-transmissive contact layer 5 adjoins the semiconductor body 21. The active zone 22 is supplied with current approximately only in these regions so that the laser radiation is generated only there. This is indicated in FIG. 9 by the hatched regions at the active zone 22.

The phosphor 3 is located completely between the semiconductor body 21 and the transparent contact layer 5. In regions between the resonators 23, the phosphor 3 touches the semiconductor body 21.

Figure 10:
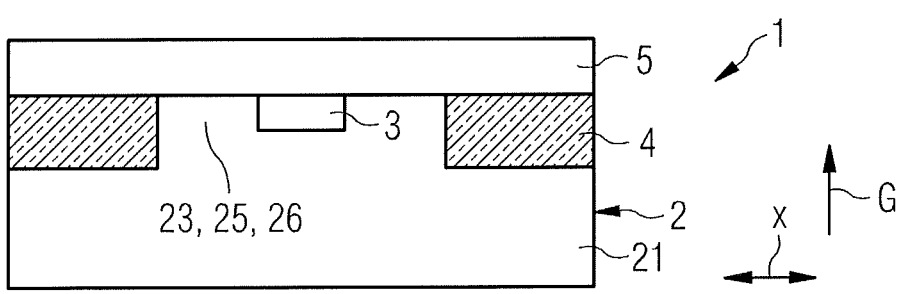

FIG. 10 illustrates that the phosphor 3 can also be located in and/or on one of the ridge waveguides 26. Thus, the phosphor 3 according to FIG. 10 is embedded in the ridge waveguide 26 and terminates flush with the ridge waveguide 26 along the growth direction G. The passivation layer 4 covers the semiconductor body 21 in regions next to the ridge waveguide 26, wherein the passivation layer 4 can terminate flush with the ridge waveguide 26 along the growth direction G. The ridge waveguide 26 is completely covered by the planar light-transmissive contact layer 5.

Such phosphors embedded in the ridge waveguide 26 can also be combined with the arrangements of the phosphors according to FIGS. 3 to 9.

Figure 11:
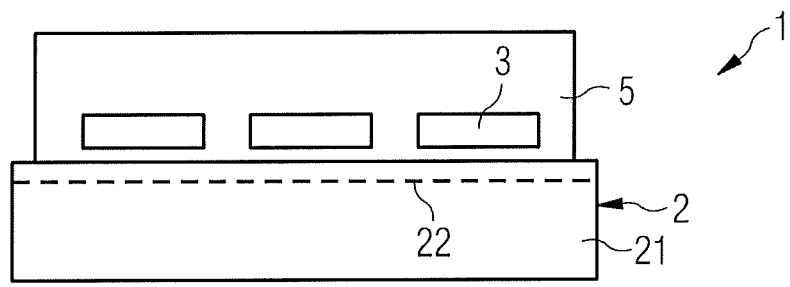

In the example of FIG. 11, in a plurality of regions which each can be associated with a resonator, the phosphor 3 is completely embedded in the light-transmissive contact layer 5. In addition to the gain-guided lasers shown in FIG. 11, such an arrangement can be used even in lasers with ridge waveguides 26.

Figure 12:
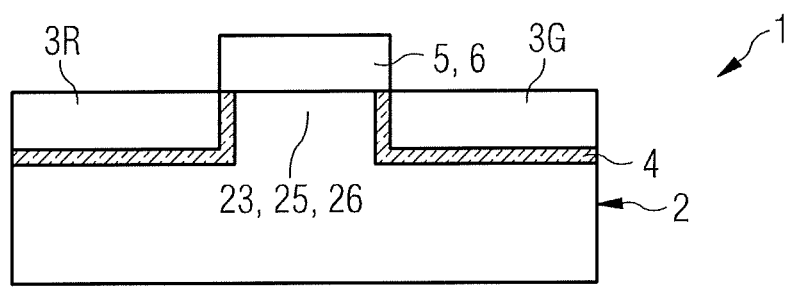

According to FIG. 12, different phosphors 3R, 3G are present. For example, red light is generated via the phosphor 3R and green light is generated via the phosphor 3G. Mixed-colored, in particular white light can thus be generated and radiated by the semiconductor light source 1, for example, in combination with a scattering means for blue laser radiation.

Figure 13:
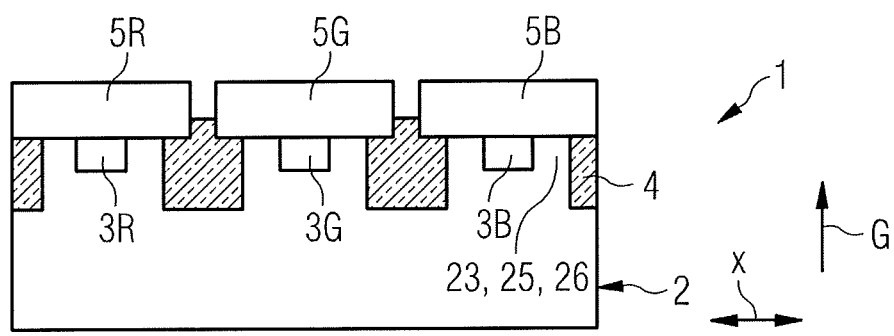

In the example of FIG. 13, a plurality of resonators 23 are present, wherein each of the resonators is uniquely assigned to one of the phosphors 3R, 3G, 3B. For example, the phosphors 3R, 3G, 3B are each embedded in the associated resonator 23. The resonators 23 are preferably electrically controllable individually and independently of one another so that an RGB light source for red, green and blue light is formed.

The respective transparent contact layers 5R, 5G, 5B can each project beyond the associated resonator 23 in the transverse direction x. Along the growth direction G, the passivation layer 4 can extend to the side faces of the contact layers 5R, 5G, 5B.

Figure 14:
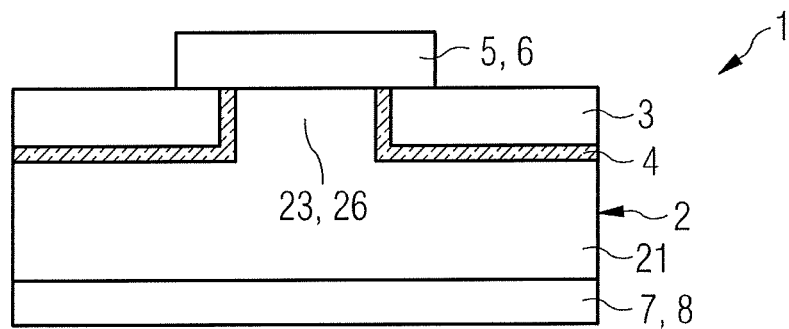

FIG. 14 illustrates that on one of the contact layers 5, 6, a mirror 7 is located on the opposite side of the semiconductor body 21. The mirror 7 can be at the same time an electrical rear side contact 8 if the mirror 7 is made of an electrically conductive material. A coupling-out efficiency of radiation on the side of the phosphor 3 is increased by such a mirror 7. Such a mirror 7 can also be present in all other examples.

For example, the mirror 7 consists of or contains metallic layers of, for example, Ag, Au, Rh, Ir and/or Al. Alternatively, the mirror 7 is designed as a Bragg reflector and has dielectric layers with alternately high and low refractive indices. It is likewise possible for a Bragg reflector to be combined with a metallic mirror.

Figure 15:
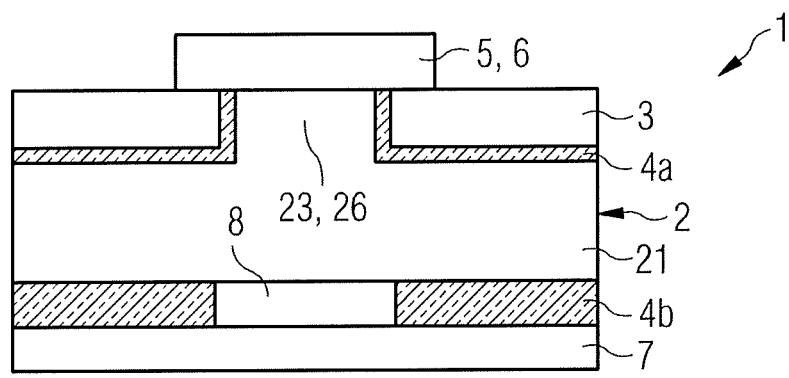

According to FIG. 15, on the one hand the mirror 7 is present in its own layer and furthermore the electrical rear side contact 8 is present directly on the semiconductor body 21. A further passivation layer 4b is located between the mirror 7 and the semiconductor body 21 in regions next to the resonator 23, which lies opposite the passivation layer 4a on the phosphor 3. The rear-side contact 8 can be restricted to a region below the resonator 23.

Figure 16:
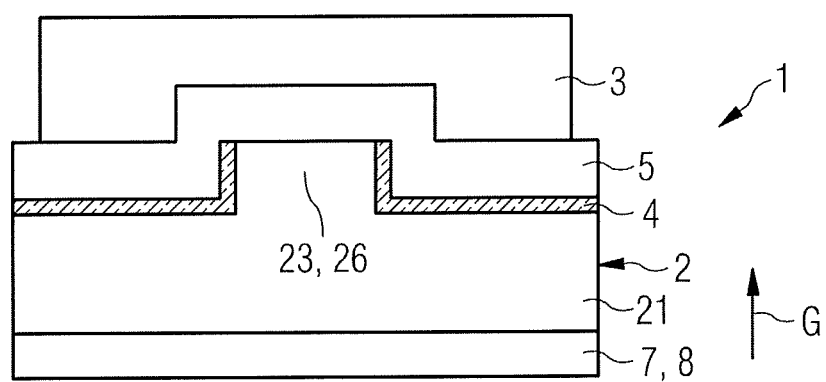

FIG. 16 illustrates that the passivation layer 4 follows the light-transmissive contact layer 5 over the whole area along the growth direction G. The phosphor 3 is applied above the contact layer 5. In this case, the contact layer 5 preferably has only a relatively small thickness, for example at most 500 nm or 300 nm, preferably at most 200 nm.

Figure 17:
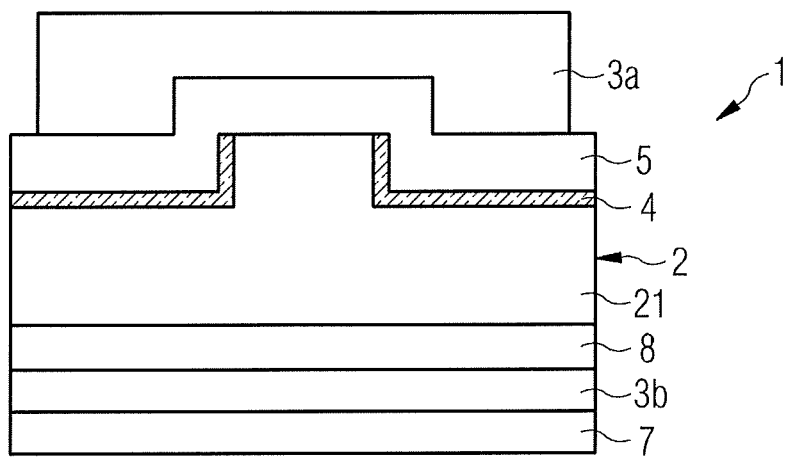

According to FIG. 17, the rear side contact 8 is located on the side opposite the contact layer 5, the rear side contact 8 can be applied over the whole area and is translucent. The first phosphor 3a is located on the transparent contact layer 5, the second phosphor 3b is located on the side of the rear-side contact 8 facing away from the semiconductor body 21. The mirror 7 is optionally located on a side of the second phosphor 3b facing away from the semiconductor body 21.

Figure 18:
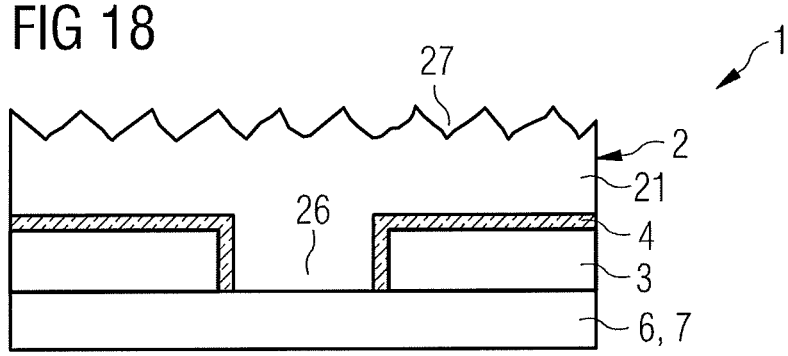

FIG. 18 shows that the semiconductor body 21 is provided with a roughening 27. By the roughening 27, the laser radiation guided in the ridge waveguide 26 is scattered towards the phosphor 3. In this case, the light-impermeable electrical contact layer 6 is preferably designed as a mirror 7 so that a coupling-out of light can take place via a non-drawn substrate on the semiconductor body 21. In such an arrangement, an improved dissipation of heat from the semiconductor body 21 can be achieved.

Alternatively or in addition to a light deflection of the laser radiation, the roughening 27 can also increase the coupling-out efficiency of the secondary radiation generated in the phosphor 3.

Figure 19:
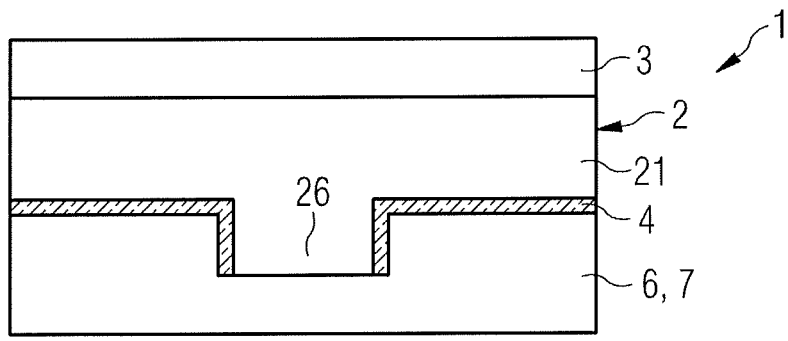

According to FIG. 19, the reflective light-impermeable contact layer 6 cools the semiconductor body 21. The phosphor 3 is located on a side of the semiconductor body 21 opposite the contact layer 6.

Figure 20:
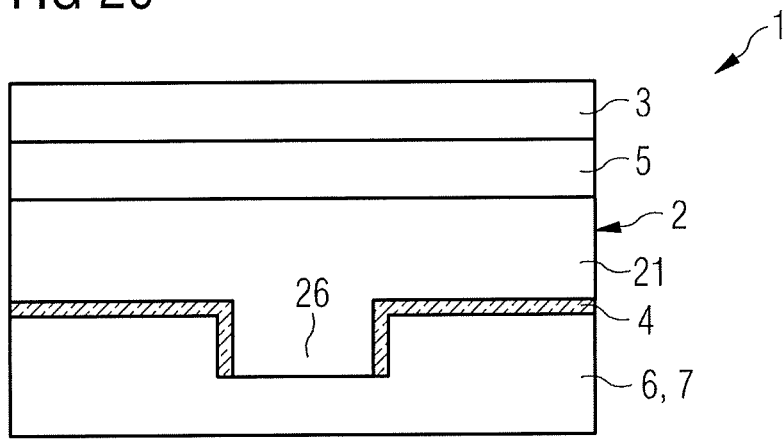

In the example of FIG. 20, the phosphor 3 is located on a side of the light-transmissive contact layer 5 facing away from the semiconductor body 21. The ridge waveguide 26 is located in the opaque contact layer 6, which is configured as a mirror 7.

Figure 21:
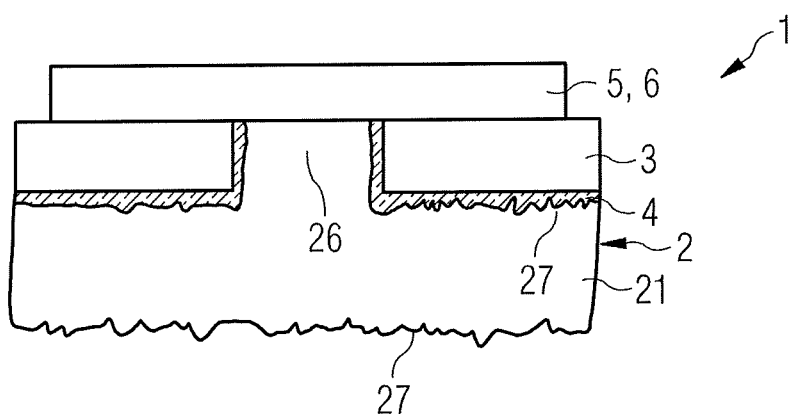

To improve the optical coupling of the phosphor 3 to the ridge waveguide 26, at the phosphor 3 a roughening 27 can be produced on the passivation layer 4 and/or on a side of the semiconductor body 21 facing away from the phosphor 3, see FIG. 21. Via the at least one roughening 27, light guided in the ridge waveguide 26 is disturbed and directed to the phosphor 3. In this case, a mean depth and/or roughness of the roughening 27 is at least $\square$/n, preferably at least 0.5 μm and/or at most 20 μm or at most 6 μm.

Figure 22:
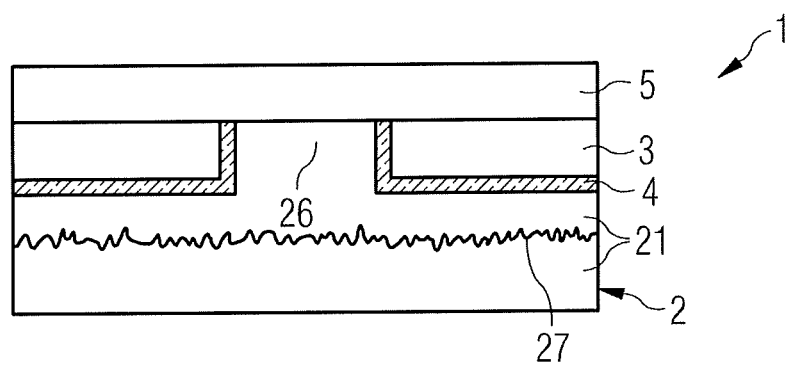

FIG. 22 shows that the roughening 27 is produced within the semiconductor body 21, for example, by specific consecutive growth conditions during production of the semiconductor body 21. Alternatively, it is possible that the roughening 27 is located between the semiconductor body 21 and a substrate (not shown), for example, a growth substrate, for example, made of sapphire. The roughening 27 can thus originate from a structured sapphire substrate, PSS for short.

Such a roughening 27, as illustrated in FIGS. 18, 21 and 22, can also be present in all other examples.

The cross-sectional representations shown in FIGS. 3 to 22 can extend in a uniform manner, unchanged composition and geometry along the entire longitudinal axis 24, compare FIG. 2. Alternatively, it is possible for different arrangements and/or phosphors 3 to be present along the longitudinal axis 24.

Figure 23:
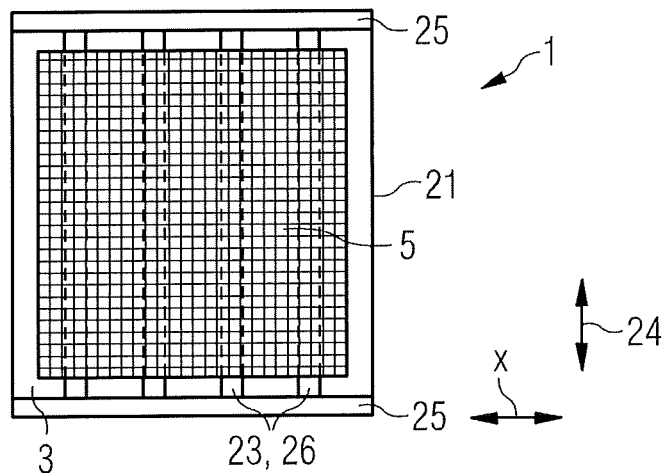
FIGS. 23 to 48 show schematic plan views of examples of our semiconductor light sources.

FIG. 23 shows a schematic plan view of the semiconductor light source 1. It can be seen that a plurality of the resonators 23 are present, each designed as a ridge waveguide 26. The highly reflective resonator mirrors 25 are oriented perpendicular to the resonators 23. The phosphor 3 covers the semiconductor body 21 preferably completely or substantially completely, except for the resonators 23.

Figure 24:
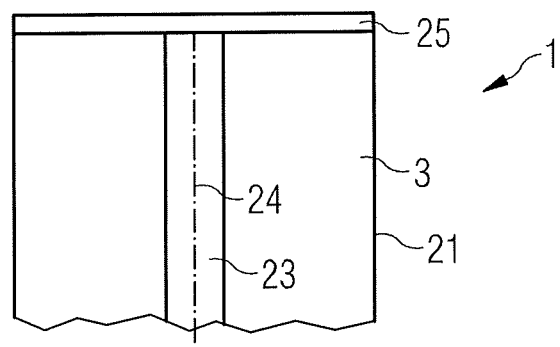

FIG. 24 illustrates that the highly reflective resonator mirror 25 is, for example, produced by a breaking of the semiconductor body 21 and a subsequent mirroring, for instance by means of a Bragg mirror. Alternatively, such end facets of the resonator 23 can also be produced by etching and optionally subsequent mirror coating.

Figure 25:
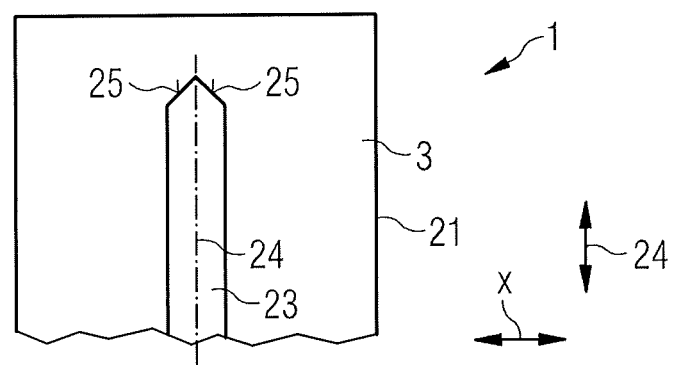

FIG. 25 shows that the facets and thus the resonator mirrors 25 taper to a point with respect to one another, in particular at an angle of 45° relative to the longitudinal axis 24. Thus, a retroreflector is obtained from the resonator mirrors 25 which can operate using total internal reflection. Furthermore, it is possible for a mirror to additionally be arranged on such a retroreflector in form of a Bragg reflector and/or in form of a metal mirror.

Figure 26:
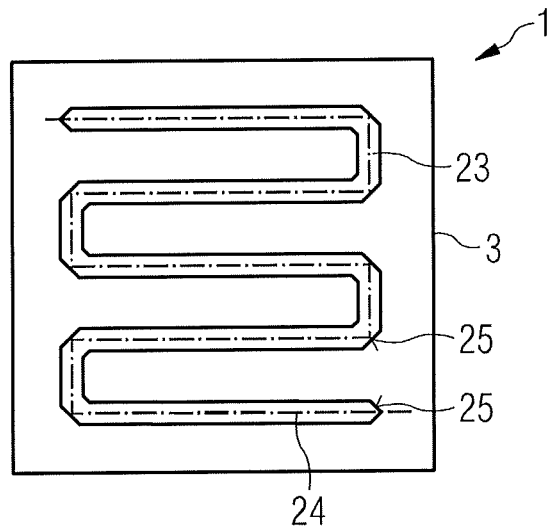

In the example of FIG. 26, the resonator 23 is designed in a meandering shape and has a plurality of bends. In the bending regions of the resonator 23, 45° facets and/or resonator mirrors 25 can be present in each case. In this case, the resonator 23 can have a plurality of regions extending parallel to one another. The longitudinal axis 24 extends in each case between two successive resonator mirrors 25.

Figure 27:
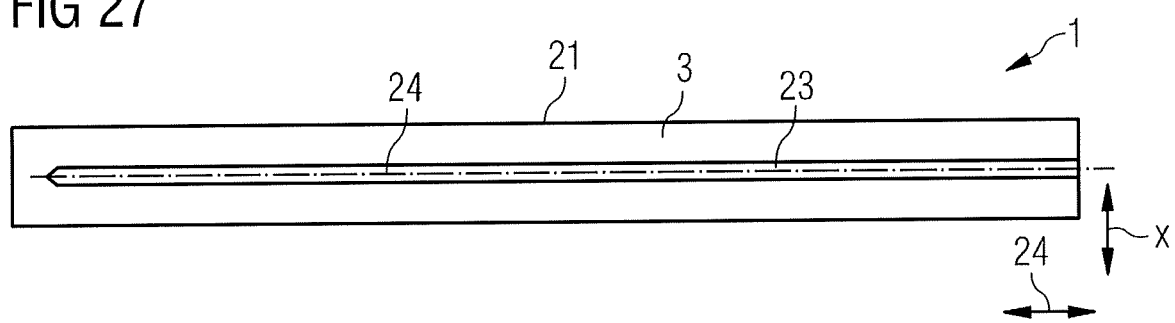

According to FIG. 27, the resonator 23 runs straight as a whole. In plan view, the semiconductor body has a high aspect ratio. For example, a quotient of an extent along the longitudinal axis 24 and an extent along the transverse direction x is at least 5 or 10 or 20 or 40. The semiconductor light source 1 thus has an elongated geometry, in contrast to normally approximately square-shaped LEDs.

Figure 28:
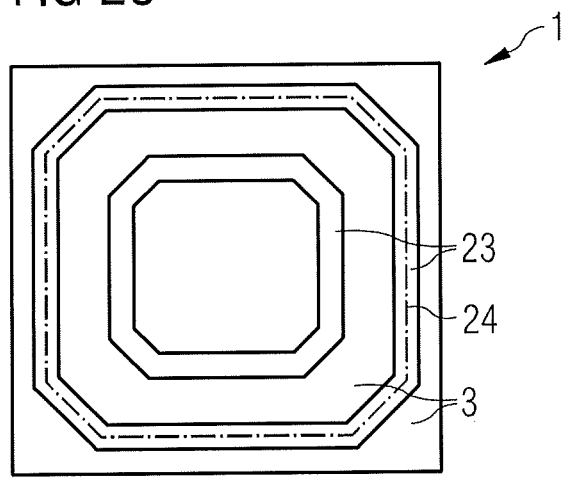

In FIG. 28, a plurality of ring resonators are provided, having an annular, closed longitudinal axis 24. The resonators 23 are approximately square or rectangular when viewed in plan view and preferably have regions for light deflection which each run obliquely at 45° at corner regions.

Figure 29:
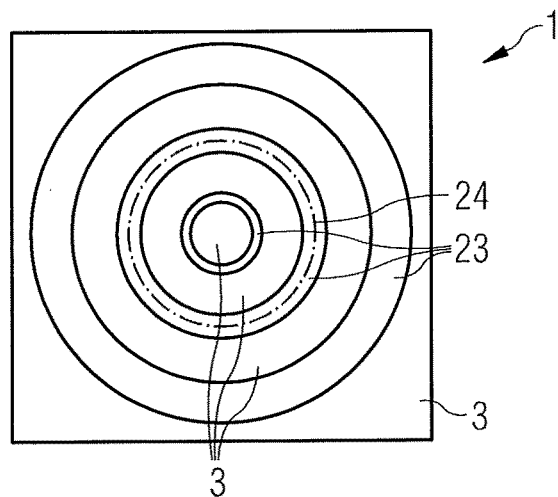

The resonators 23 as illustrated in FIG. 29 are a plurality of circular ring resonators running concentrically with respect to one another. In this case, the resonator mirrors are formed by reflecting side faces tangentially to the circular ring resonator.

In contrast to FIGS. 28 and 29, only one closed ring resonator 23 can also be present.

In the arrangements of FIGS. 28 and 29, resonator end facets, which are susceptible to faults, can thus be avoided.

Figure 30:
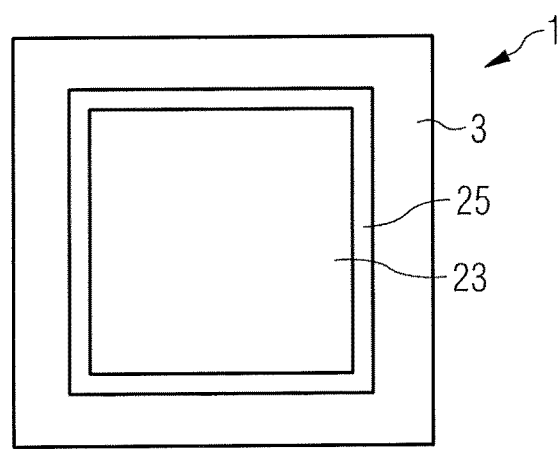

In the example of FIG. 30, a multi-sided mirror-coated resonator 23 is present in which ring modes can form. The all-around resonator mirror 25 is surrounded by the phosphor 3.

Figure 31:
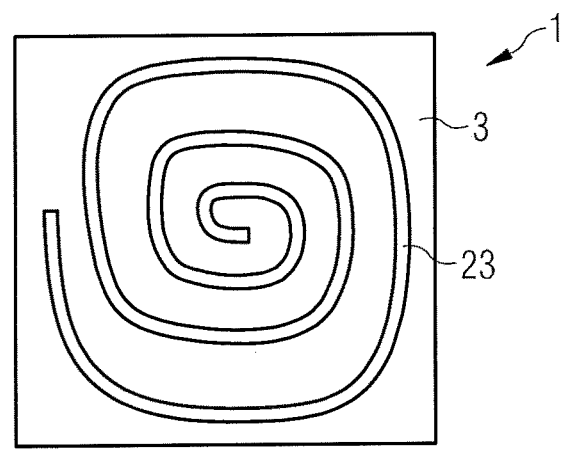

The resonator 23 according to FIG. 31 is designed as a worm resonator and has a spiral shape so that radii of curvature of the resonator 23 can decrease inwards and the resonator 23 contracts inwards.

The resonators of FIGS. 23 to 31 can be combined with all the configurations of the phosphor 3 and of the laser 2 as illustrated in connection with FIGS. 3 to 22. The same applies to the resonators 23 of FIGS. 32 to 39 explained below.

Figure 32:
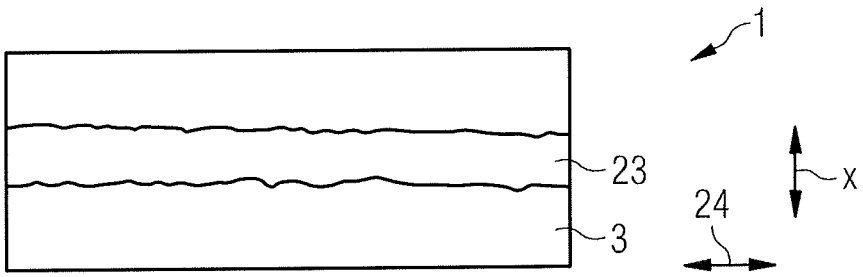

To increase the coupling-out of the laser radiation from the resonator 23, the side faces of the resonators 23, in particular of the ridge waveguides, can be selectively structured and/or roughened. FIG. 32 illustrates that the roughening on the side faces of the ridge waveguide and of the resonator 23 is irregular.

Figure 33:
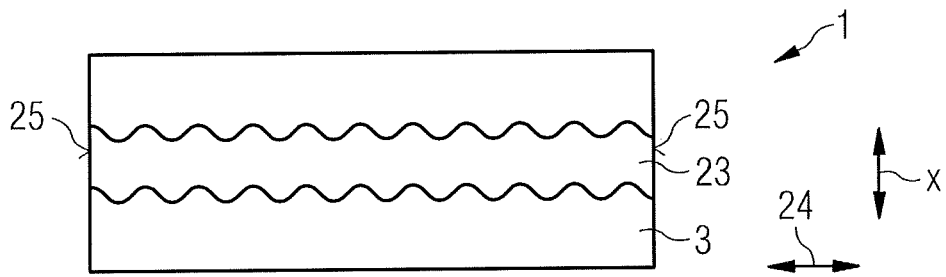

According to FIG. 33, a regular, sinusoidal structuring is present. In contrast to what is shown in FIG. 33, according to which the structuring runs on both side faces of the resonator 25 in the same phase, the longitudinal axis 24 can represent an axis of symmetry for the structuring. In this case, an average width of the resonator 23 in the transverse direction x is, for example, approximately 15 µm, and a modulation by the roughening is, for example, in the range of approximately 3 µm, corresponding to 20%. A modulation period along the longitudinal axis 24 of the roughening is, for example, at least 50% and/or at most 300% of the average width of the resonator 23. Alternatively or additionally, the modulation period is at least 1 µm or 10 µm and/or at most 100 µm or 500 µm. In this case, the resonator 23 is oriented perpendicularly or approximately perpendicularly to the facets and resonator mirrors 25, as is preferably also valid in all other examples.

Figure 34:
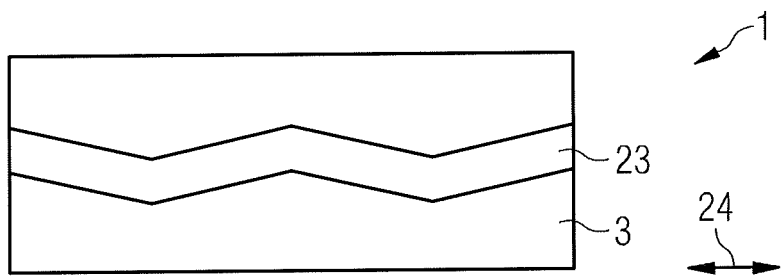

According to FIG. 34, the resonator 23 has a plurality of kinks. A kink angle is preferably at most 45° or 30° or 15° and/or at least 0.5° or 1° or 5° or 10°, relative to the longitudinal axis 24. A distance between successive kinks is preferably at least 150% or 400% and/or at most 1000% or 600% of the average width of the resonator 23. The width of the resonator 23 can be constant or approximately constant along the longitudinal axis 24. Alternatively or additionally, the distance between successive kinks is at least 1 µm or 10 µm and/or at most 100 µm or 500 µm.

Figure 35:
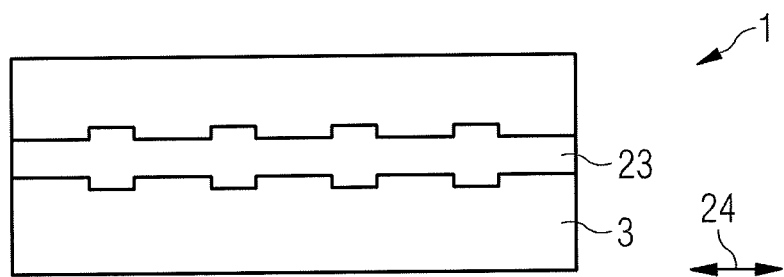

According to FIG. 35, the resonator 23 has rectangular narrowings and widenings, wherein the longitudinal axis 24 can be a line of symmetry. The narrowings amount to approximately 20% of the average width of the resonator 23. A distance between adjacent narrowings is preferably smaller than a length of the respective narrowing along the longitudinal axis 24. The average length of the narrowings is, for example, at least 50% and/or at most 400% of the average width of the resonator 23.

The resonator shapes, as disclosed in connection with FIG. 33 or 35, are particularly preferred.

Figure 36:
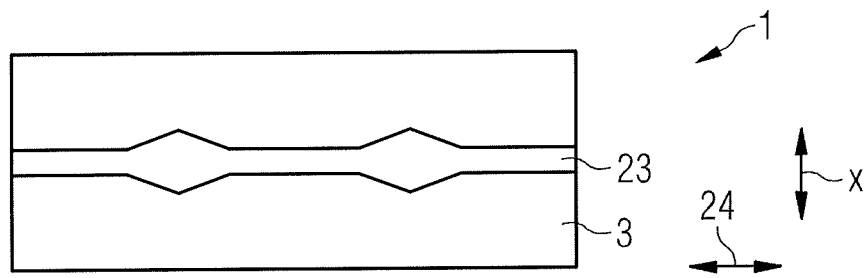

In the example of FIG. 36, the resonator 23 has widened portions that are diamond-shaped or trapezoidal or parallelogram-shaped. In this case, the longitudinal axis 24 is preferably not an axis of symmetry for the widened portions. With regard to the dimensions of the widened portions, preferably the description with regard to FIG. 33 and to FIG. 35 applies accordingly.

In addition or as an alternative to the roughening or structuring of FIGS. 32 to 36, the resonator 23 can run in a curved manner to increase leakage losses from the resonator

23. Preferably, the ends of the resonators 23 are in turn oriented perpendicular or approximately perpendicular to the facets and/or resonator end mirrors 25 of the semiconductor body 21 to enable a high reflectivity and a good overlap between incident and reflected wave.

Figure 37:
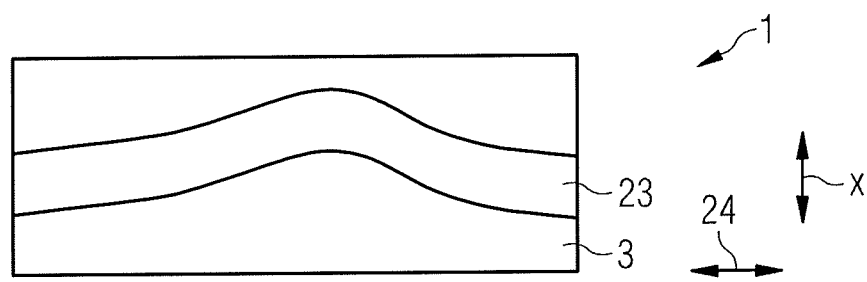

According to FIG. 37, different curvatures are present along the resonator 23. In particular, smaller radii of curvature are present in a central region along the longitudinal axis 24 of the resonator 23. The resonator 23 can have an axis of symmetry parallel to the transverse direction x.

Figure 38:
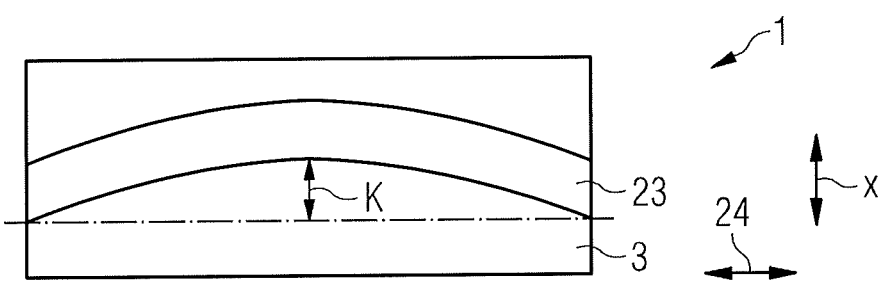

FIG. 38 shows that a uniform curvature K is present. For example, the curvature K is circular-arc-shaped. An extent of the curvature K in the direction parallel to the transverse axis x is preferably at least 50% and/or at most 150% or 500% of the average width of the resonator 23. Alternatively or additionally, the extent of the curvature K can be 1 µm to 50 µm.

Figure 39:
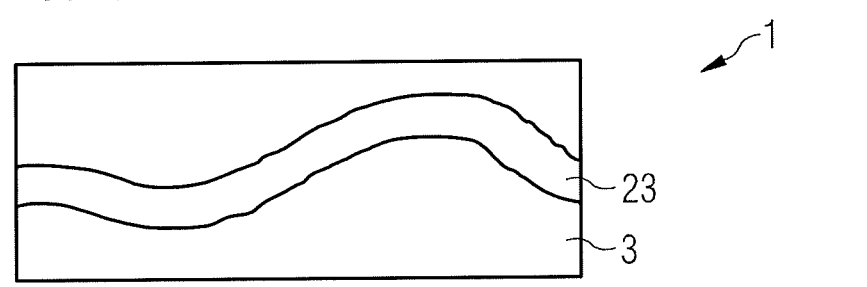

In the example of FIG. 39, the roughening of FIG. 32 is combined with a curved, sinusoidal course. Instead of the roughening of FIG. 32, the structures of FIGS. 33 to 36 can also be used.

Figure 40:
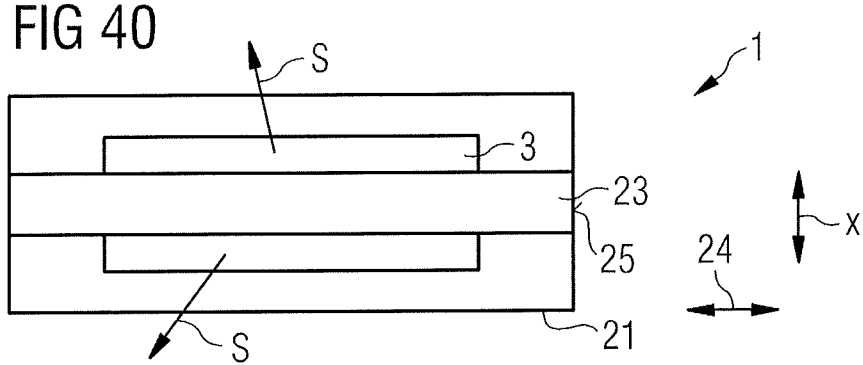

In the example of FIG. 40, the phosphor 3 is located only in places along the longitudinal axis 24 on the resonator 23. For example, regions close to the resonator mirror 25 are free of the phosphor 3. In contrast to FIG. 40, it is possible that the phosphor 3 is present in sections along the longitudinal axis 24, for example, in a manner analogous to the enlargements of FIG. 35 or 36. Further, in contrast to FIG. 40, the phosphor 3 can also be applied asymmetrically, in relation to the resonator 23 as an axis of symmetry.

As shown in FIG. 40, only the secondary radiation S exits the semiconductor laser 1. The laser radiation is thus coupled out of the resonator 23 only in regions provided with the phosphor.

Figure 41:
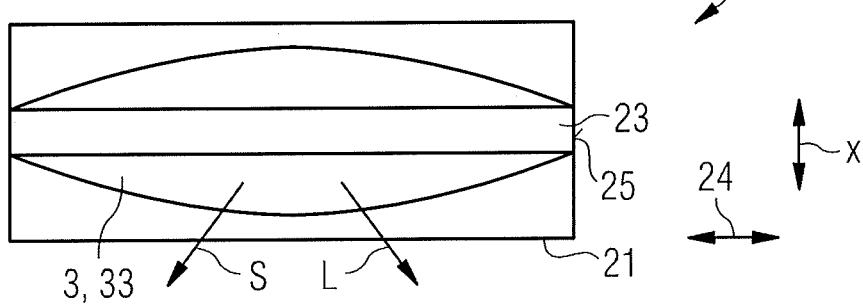

In contrast, according to FIG. 41, the laser radiation L is also radiated. In other words, there is no full conversion of the laser radiation L to the secondary radiation S. This can be achieved by a relatively small thickness and/or amount of the phosphor 3. In this case, the emerging laser radiation L is scattered so that a coherence length is considerably reduced and emerging, for example, white, mixed light is not or not significantly capable of interference. To reduce the coherence length, it is optionally possible to provide a scattering means 33, as also in all other examples.

In addition, it is possible, as in all other examples, that the phosphor 3 and/or the scattering means 33 are applied along the longitudinal axis 24 with a varying thickness, for example, with a greater thickness in regions further apart from the resonator mirrors 25.

Figure 42:
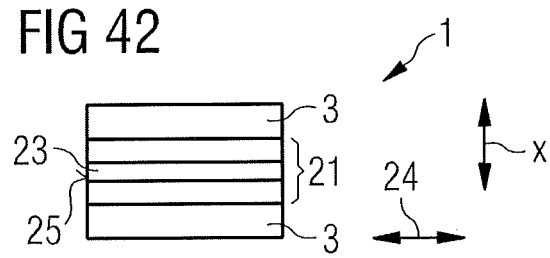

In the example of FIG. 42, the phosphor 3 is located completely alongside the semiconductor body 21, seen in plan view. In this case, an optical coupling of the phosphor 3 to the resonator 23 takes place, for example, via so-called substrate modes and/or by roughening.

Figure 43:
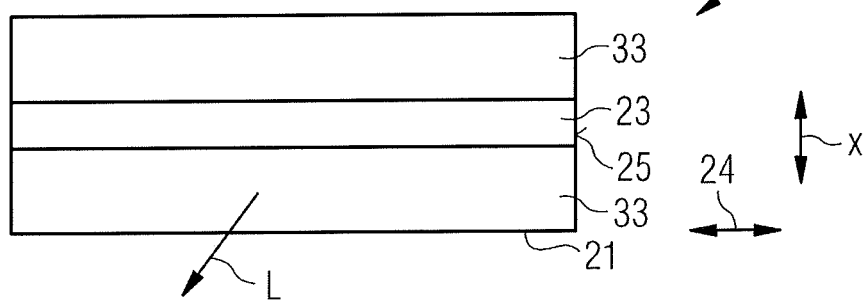

Finally, in the example of FIG. 43, only the scattering means 33, and no phosphor, is present. The reduction of the coherence length is thus achieved by the scattering means 33. There is no or no significant change in the color of the laser radiation L due to the scattering means.

Figure 44:
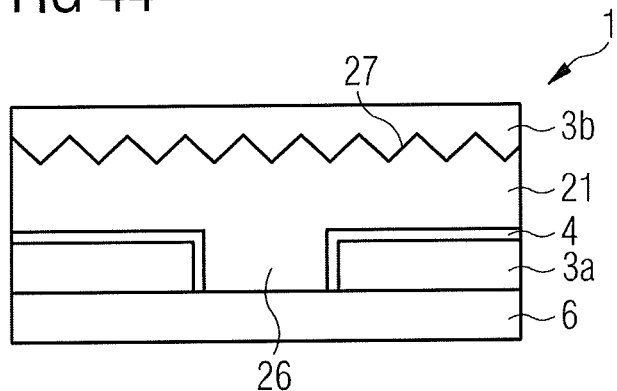

In the example of FIG. 44, the semiconductor body 21 has the roughening 27 on a side facing away from the ridge waveguide 26. A first phosphor 3a is located on both sides of the ridge waveguide 26. At the roughening 27, the semiconductor body 21 is completely or alternatively only partially covered with a second phosphor 3b. The phosphors 3a, 3b can have the same composition or different phosphors can be used.

The roughening 27 can be located in a semiconductor layer sequence of the semiconductor body 21 or also in a substrate, such as a GaN substrate, of the semiconductor body 21. Deviating from the representation in FIG. 44, it is possible that the phosphor 3b and/or the roughening 27 are/is restricted to a region opposite the ridge waveguide 26 so that for example a width of the phosphor 3b and/or of the roughening 27 is at most twice or three times the width of the ridge waveguide 26.

Figure 45:
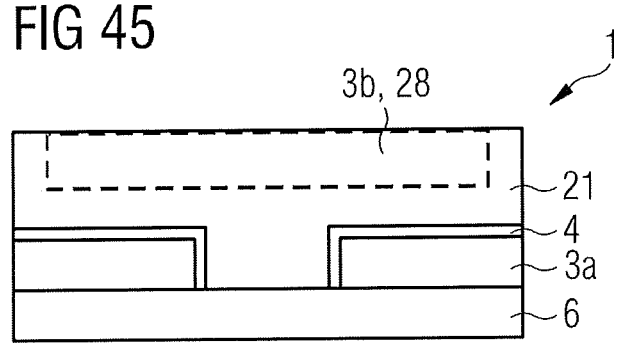
Figure 46:
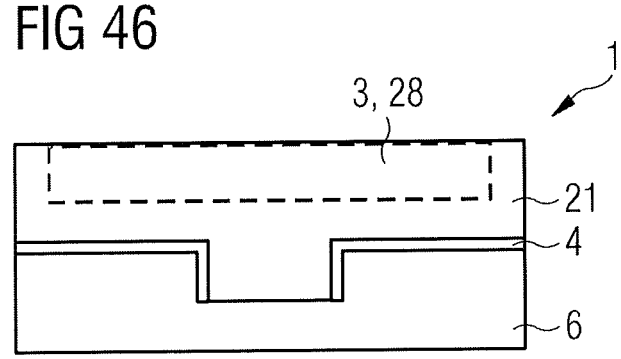

The semiconductor light source 1 of the examples of FIGS. 45 and 46 each have a recess 28, in particular on the side facing away from the ridge waveguide 26. Alternatively, a plurality of recesses 28 can also be provided. The at least one recess 28 is preferably formed in the semiconductor body 21, for example in the substrate of the semiconductor body 21.

The recess 28 is partially or preferably completely filled with the phosphor 3, 3b. The phosphor 3, 3b in the recess 28 can be present in addition to the phosphor 3a next to the ridge waveguide 26, see FIG. 45. Likewise, only the phosphor 3 in the recess 28 can be present as shown in FIG. 46.

Figure 47:
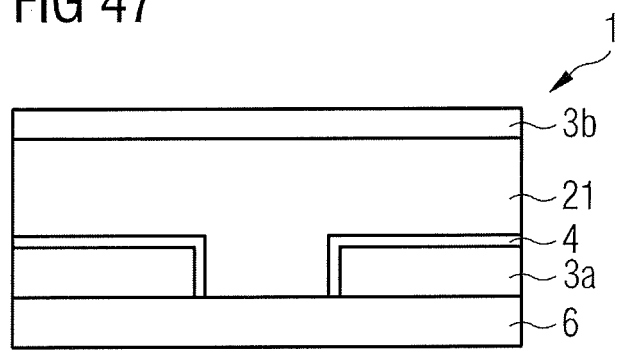

In the example of FIG. 47, for example, to improve color rendering, in particular of the red component, an additional red converter surface is applied to a second phosphor 3b to generate red light. The first phosphor 3a preferably generates yellow light that can in particular intermix with blue light from the semiconductor body 21 to form white light.

In this case, the red phosphors 3b can cover a larger area than the phosphors 3a for other colors since the red phosphors are often inefficient. The red phosphor 3b can be applied directly to the semiconductor body 21, as shown in FIG. 47, for example, without roughening. Alternatively, a roughening can be present analogously to FIG. 44 and/or an intermediate layer (not shown) is located between the semiconductor body 21 and the phosphor 3b, for example, an adhesive layer, for example, if the phosphor 3b is a ceramic layer.

Such a configuration with a red phosphor 3b can also be present in all other examples.

Figure 48:
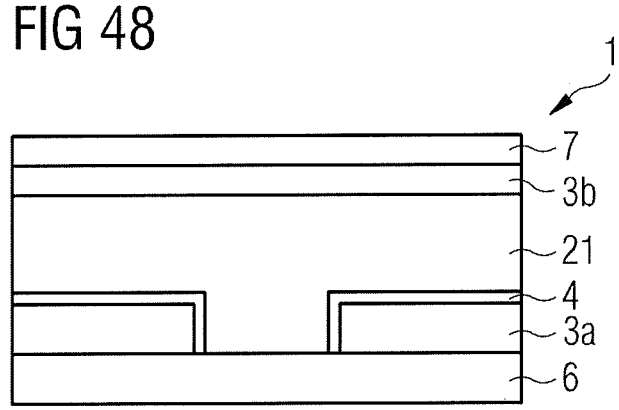

To correctly set the color locus of the emitted light and/or efficiently convert the laser light, for example, to fully convert it, it is possible for the semiconductor light source 1 to be provided on one or more sides with a wavelength-selective mirror 7 as shown in FIG. 48. For example, the mirror 7 is permeable to the light emitted by the at least one phosphor 3a, 3b, but has a reflective effect for the laser light as generated in the semiconductor body 21. This can be achieved, for example, by a Bragg mirror having a plurality of λ/4 layers, wherein λ is the laser wavelength, in particular the wavelength of maximum intensity. Deviating from the representation in FIG. 48 it is possible for the mirror 7 to be located between the second, preferably red phosphor 3b and the semiconductor body 21. Again, a roughening can be present.

Such a mirror 7 that can also cover side faces of the semiconductor light source 1, can also be present in all other examples.

Our light sources are not restricted by the description on the basis of the examples. Rather, this disclosure encompasses any new feature and also any combination of features, which includes in particular any combination of features in the appended claims, even if the feature or combination itself is not explicitly specified in the claims or examples.

This application claims priority of DE 10 2016 111 442.1, the subject matter of which is incorporated herein by reference.

The invention claimed is:

1. A semiconductor light source comprising a laser and at least one phosphor, wherein
the laser comprises a semiconductor body having at least one active zone that generates laser radiation,
at least one resonator having resonator mirrors and having a longitudinal axis is formed in the laser so that the laser radiation is guided and amplified along the longitudinal axis during operation and the active zone is located at least partially in the resonator, and
the phosphor is optically coupled to the resonator in a gap-free manner so that in the direction transverse to the longitudinal axis at least part of the laser radiation is introduced into the phosphor and converted into a secondary radiation having a greater wavelength.

2. The semiconductor light source according to claim 1, wherein the semiconductor body has an elevation along the longitudinal axis such that a ridge waveguide is formed from a semiconductor material of the semiconductor body,
only the secondary radiation and not the laser radiation leaves the semiconductor light source, and
the resonator mirrors are oriented perpendicular to the longitudinal axis and are configured to couple out at most 20% of the laser radiation from the resonator.

3. The semiconductor light source according to claim 2, wherein the phosphor is at least partially adjacent to the ridge waveguide, in the direction perpendicular to a growth direction of the semiconductor body and in the direction transverse to the longitudinal axis.

4. The semiconductor light source according to claim 2, wherein the ridge waveguide at least in places extends in a curved manner between two successive resonator mirrors when seen in a plan view.

5. The semiconductor light source according to claim 2, wherein the ridge waveguide has a varying width at least in regions.

6. The semiconductor light source according to claim 5, wherein the width varies by at least 1% and at most 30%, relative to an average width of the ridge waveguide.

7. The semiconductor light source according to claim 1, wherein the semiconductor body has an elevation along the longitudinal axis such that a ridge waveguide is formed from a semiconductor material of the semiconductor body, and
in addition to the secondary radiation, part of the laser radiation leaves the semiconductor light source so that mixed-colored light is emitted during operation, wherein a coherence length of the mixed-colored light is at most 10 µm.

8. The semiconductor light source according to claim 1, wherein the laser is configured to be operated in a gain-guided manner so that the semiconductor body has a constant thickness in the region of the resonator.

9. The semiconductor light source according to claim 1, wherein the semiconductor body is provided on at least one main side with a roughening, and the phosphor extends at least partially on the same side of the semiconductor body as the roughening or at a side of the semiconductor body lying opposite the roughening.

10. The semiconductor light source according to claim 1, wherein the phosphor is in direct contact with the semiconductor body.

11. The semiconductor light source according to claim 1, wherein the phosphor is of a semiconductor material.

12. The semiconductor light source according to claim 1, wherein the phosphor does not touch the semiconductor body, and a minimum distance between the phosphor and the semiconductor body is at most 0.5 µm.

13. The semiconductor light source according to claim 1, wherein between the phosphor and the semiconductor body in places only an electrically insulating passivation layer which is permeable to the laser radiation is located.

14. The semiconductor light source according to claim 1, wherein between the phosphor and the semiconductor body in places only an electrically conductive contact layer for supplying current to the semiconductor body and permeable for the laser radiation is arranged.

15. The semiconductor light source according to claim 1, wherein at least part of the phosphor is embedded into the semiconductor body so that the semiconductor body is located on at least three sides of the embedded phosphor.

16. The semiconductor light source according to claim 1, wherein the laser has a plurality of the resonators and each of the resonators is configured to radiate the laser radiation into the phosphor, and at least part of the phosphor is located between two adjacent resonators.

17. The semiconductor light source according to claim 1, wherein the resonator is curved or bent when viewed in a plan view, and the phosphor extends along the entire resonator and the laser radiation is radiated into the phosphor along the entire resonator.

18. The semiconductor light source according to claim 1, wherein the phosphor extends only partly along the longitudinal axis.

19. A semiconductor light source comprising a laser and at least one scattering means, wherein
the laser comprises a semiconductor body having at least one active zone that generates laser radiation,
at least one resonator having resonator mirrors and having a longitudinal axis is formed in the laser so that the laser radiation is guided and amplified along the longitudinal axis during operation and the active zone is located at least partially in the resonator, and
the scattering means is optically coupled to the resonator in a gap-free manner so that in the direction transverse to the longitudinal axis the laser radiation is introduced into the scattering means and is scattered by the same so that a coherence length of the emitted laser radiation is reduced to at most 10 µm by the scattering means.

* * * * *

UNITED STATES PATENT AND TRADEMARK OFFICE
CERTIFICATE OF CORRECTION

PATENT NO. : 10,673,201 B2
APPLICATION NO. : 16/311868
DATED : June 2, 2020
INVENTOR(S) : Eichler et al.

Page 1 of 1

It is certified that error appears in the above-identified patent and that said Letters Patent is hereby corrected as shown below:

On the Title Page

At (87) PCT Pub. No.:, please change "WO2018/220325" to --WO2017/220325--.

Signed and Sealed this
Fourteenth Day of July, 2020

Andrei Iancu
*Director of the United States Patent and Trademark Office*